United States Patent [19]

Yamamoto et al.

[11] Patent Number: 4,855,250

[45] Date of Patent: Aug. 8, 1989

[54] METHOD OF MANUFACTURING A SEMICONDUCTOR LASER WITH AUTODOPING CONTROL

[75] Inventors: Motoyuki Yamamoto, Kanagawa; Yasuhiko Tsuburai, Tokyo, both of Japan

[73] Assignee: Kabushiki Kaisha Toshiba, Kanagawa, Japan

[21] Appl. No.: 138,660

[22] Filed: Dec. 28, 1987

[30] Foreign Application Priority Data

Dec. 26, 1986 [JP] Japan .................................. 61-315346

[51] Int. Cl.[4] ........................ H01L 21/208; H01L 7/00
[52] U.S. Cl. ................................ 437/81; 148/DIG. 7; 148/DIG. 41; 148/DIG. 56; 148/DIG. 72; 148/DIG. 95; 148/DIG. 110; 156/613; 372/48; 437/96; 437/129; 437/133; 437/167; 437/949; 437/971; 437/987
[58] Field of Search ................ 148/DIG. 7, DIG. 22, 148/DIG. 25, DIG. 41, DIG. 56, DIG. 65, DIG. 72, DIG. 95, DIG. 110, DIG. 169; 156/610–615; 437/81, 87, 95, 96, 107, 110, 126, 129, 133, 184, 949, 991, 987, 167; 357/16, 17; 372/45, 46, 48

[56] References Cited

U.S. PATENT DOCUMENTS

| | | | |
|---|---|---|---|
| 3,909,317 | 9/1975 | Itoh et al. | 437/98 |
| 3,929,526 | 12/1975 | Nuttall et al. | 156/612 |
| 3,956,037 | 5/1976 | Ishii et al. | 437/95 |
| 4,074,305 | 2/1978 | Johnston, Jr. et al. | 437/184 |
| 4,226,648 | 10/1980 | Goodwin et al. | 437/9 |
| 4,371,967 | 2/1983 | Wada et al. | 357/17 |
| 4,433,417 | 2/1984 | Burnham et al. | 372/45 |
| 4,567,060 | 1/1986 | Hayakawa et al. | 372/46 |
| 4,635,268 | 1/1987 | Motegi et al. | 372/45 |
| 4,691,321 | 9/1987 | Motegi et al. | 372/46 |
| 4,716,129 | 12/1987 | Taneya et al. | 437/133 |
| 4,734,385 | 3/1988 | Mihashi et al. | 437/129 |

FOREIGN PATENT DOCUMENTS

60-14482 1/1985 Japan .
60-137085 7/1985 Japan .

OTHER PUBLICATIONS

Single-Longitudinal-Mode Metalorganic Chemical-Vapor-Deposition Self-Aligned GaAlAs--GaAs Double-Heterostructure Lasers, by J. J. Coleman and P. D. Dapkus, in Appl. Phys. Lett. 37(3), Aug. 1, 1980.

Primary Examiner—Brian E. Hearn
Assistant Examiner—William Bunch
Attorney, Agent, or Firm—Philip M. Shaw, Jr.

[57] ABSTRACT

A method of manufacturing a semiconductor light emitting device by forming a compound semiconductor structure with homo- or heterojunction therein having a first p-type compound semiconductor crystal layer at the top of the structure, growing a second p-type compound semiconductor crystal layer on the structure in a reactor, wherein, before the beginning of the crystal growth step, a p-type dopant is caused to flow into the reactor in which the structure is placed. In some embodiments, the flow of the p-type dopant continues after the completion of the crystal growth.

11 Claims, 8 Drawing Sheets

METHOD OF MANUFACTURING A SEMICONDUCTOR LASER WITH AUTODOPING CONTROL

BACKGROUND OF THE INVENTION

This invention relates to a method of manufacturing a semiconductor light emitting device such as light emitting diodes or semiconductor lasers, and more particularly relates to a method of manufacturing a semiconductor light emitting device using compound semiconductor crystal having aluminum as a basic material.

In recent years, as applications of semiconductor lasers have been developed, highly efficient mode-controlled semiconductor lasers have been required as a light source for optical fiber communication and for use in reading optical disks such as Digital Audio Disk (DAD), Video Disk and Document File. One of the semiconductor lasers which has been developed for that purpose has a substrate with grooves so as to achieve current confinement effect. Another has a double heterostructure whose upper layer is appropriately processed so that both the current confinement effect and the optical confinement effect might be achieved.

Also, Metalorganic Chemical Vapor Deposition (MOCVD) has been developed and applied to the manufacture of some semiconductor lasers.

A mode controlled heterojunction semiconductor laser which has a current confinement effect and a refractive index guide effect is disclosed in Japanese Provisional Publication No. 60-14482. FIG. 1 shows this type of heterojunction semiconductor laser, in which current is confined only in the stripe portion 10 so that the threshold current at which oscillation starts might be as small as 15 mA.

The light generated in the active layer 16 is also confined in the stripe portion 10 owing to the difference of the refractive index between the stripe portion 10 and its outer portions. Consequently, the longitudinal mode of this semiconductor laser is stable until an output power range of 30 mW during continuous operation is achieved. However, this type of semiconductor laser has disadvantages associated with the manufacturing method described below.

After n-type GaAs substrate 12, n-type $Ga_{0.6}Al_{0.4}As$ cladding layer 14, undoped $Ga_{0.94}Al_{0.06}As$ active layer 16, p-type $Ga_{0.6}Al_{0.4}As$ cladding layer 18, and n-type $Ga_{0.6}Al_{0.4}As$ current blocking layer 20 are grown successively, the current blocking layer 20 and cladding layer 18 are partially etched away using photolithographic techniques to form stripe portion 10 at the center. Then, p-type $Ga_{0.7}Al_{0.3}As$ optical guide layer 22, p-type $GA_{0.6}Al_{0.4}As$ cladding layer 24 and p-type GaAs contact layer 26 are additionally grown on that surface successively by MOCVD.

In this process, the p-type cladding layer 18 is doped with high vapor pressured zinc. The result is that the zinc might evaporate in hydrogen atmosphere when the reactor is heated up in order to grow the optical guide layer 22, the cladding layer 24 and the contact layer 26. Accordingly, the density of the acceptors in the stripe portion 10 becomes lower as shown in FIG. 1 or the surface 30 of that portion 10 may turn to n-type if things come to the worst. The low density of acceptors in stripe portion 10 makes the current concentrate on the circumference 28 of the stripe portion 10 so that it might be damaged by light and heat caused by the current and the lifetime of the semiconductor laser might be shortened.

Further, the surface 30 of the stripe portion 10 turns to an n-type from a p-type, a n-p-n-p thyristor structure is formed with the n-type active layer 16, the p-type cladding layer 18, the n-type surface region 30 of the cladding layer 18 and the p-type optical guide layer 22. As a result, the p-n junction formed between the n-type surface portion 30 of the cladding layer and the p-type cladding layer 18 resists the flow of current until it breaks down. This means that the threshold current of the device becomes higher and the operating characteristic becomes worse as shown in FIG. 8.

Moreover, the carrier density of the contact layer 26 must be above $1 \times 10^{19} cm^{-3}$ in order to make good contact between the metal contact 32 and the contact layer 26 because the metal contact 32 comprises nonalloys such as Ti/Pt/Au. However, while the temperature of the reactor becomes low after growth of the contact layer 26 is completed, the partial pressure for the zinc decreases so that the zinc might evaporate from the surface of the contact layer 26. Accordingly, as shown in FIG. 1, the surface density of the contact layer decreases and contact resistance increases. An additional step of etching the contact layer 26 by about 1 $\mu$m is required in order to decrease the resistance.

In addition, when the additionally grown layers consisting of the optical guide layer 22, the cladding layer 24 and the contact layer 26 are formed, the exposed surface of the cladding layer 18 or the stripe portion 10 may be covered with an aluminum oxide layer. This type of oxide layer would cause a voltage drop between the cladding layer 18 and the optical guide layer 22. Therefore, the device might be heated up. The characteristics of a semiconductor laser are very sensitive to the operation temperature. Namely, a higher temperature is more harmful to the operation of the device. For example, if the operation temperature rises by 10° C., the lifetime of the device is shortened to about a half.

SUMMARY OF THE INVENTION

The first object of this invention is to provide a method of manufacturing a semiconductor light emitting device which can improve the initial characteristics and the lifetime of the device.

The second object of this invention is to provide a method of manufacturing a semiconductor light emitting device in which a good metal contact can be formed.

In order to achieve the first object, a method of manufacturing a semiconductor light emitting device according to this invention comprises the steps of forming a compound semiconductor structure with a homo or a hetero p-n junction therein having a first p-type compound semiconductor crystal layer containing aluminum at the top of the structure, flowing a p-type dopant into a reactor in which said compound semiconductor structure is placed and growing a second p-type compound semiconductor crystal layer containing aluminum on said first p-type compound semiconductor crystal layer in said reactor.

In order to achieve the second object, a method of manufacturing a semiconductor light emitting device according to this invention comprises the steps of forming a compound semiconductor structure with a homo or a hetero p-n junction therein having a first p-type compound semiconductor crystal layer containing aluminum at the top of the structure, flowing a p-type dopant into the reactor in which said compound semiconductor structure is placed, growing a second p-type compound semiconductor crystal layer containing aluminum on said first p-type compound semiconductor crystal layer in said reactor and continuing to flow said p-type dopant into said reactor after the completion of said second compound semiconductor crystal layer.

For example, in a GaAlAs semiconductor laser using zinc as p-type dopant, DEZn, which is material of Zn, is caused to flow into the reactor together with $H_2$ gas where the wafer is placed before the reactor is heated up so that Zn will be prevented from evaporating through the exposed surface of p-type GaAlAs when the p-type additional GaAlAs layer is grown on the surface by MOCVD.

Further, when the temperature of the reactor is decreased after the completion of the growth of the additional layers, the evaporation of Zn from the top of the layers can be prevented by flowing DEZn to the reactor.

According to the above-mentioned method, as the partial pressure of the evaporating p-type dopant from the crystal becomes equal to that of the p-type dopant caused to flow into the reactor, the evaporation of the p-type dopant can be substantially avoided. As a result, the acceptor density at the interface between the grown layer and the growing layer can be prevented from decreasing so that the lifetime of the device may be improved. Further, as the surface of the p-type layer is prevented from turning to the n-type, the threshold current remains at a low level.

Further, a shortened lifetime of the device due to heat occurring during operation is avoided because of the high impurity density at the interface between the grown layer and the additionally grown layer.

In addition, good metal contact is provided by flowing p-type dopant into the reactor after the completion of the additional growth step to avoid the evaporation of p-type impurity from the top of the additionally grown layer.

The foregoing and other objectives, features and advantages of the invention will be more readily understood upon consideration of the following detailed description of certain preferred embodiments of the invention, taken in conjunction with the accompanying drawings.

DETAILED DESCRIPTION OF THE PREFERRED EMBODIMENT

Figure 1:
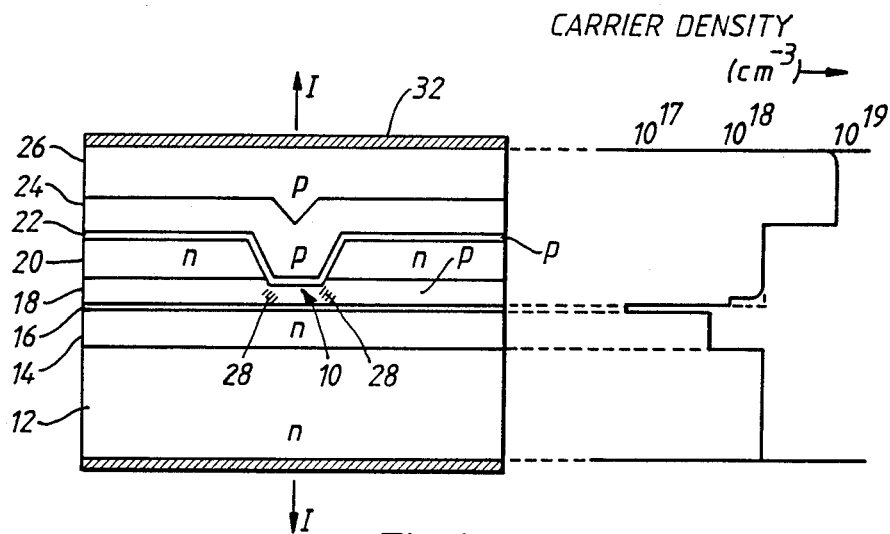
FIG. 1 and FIG. 2 are cross-sectional views of a semiconductor laser manufactured by conventional steps in reference to the disadvantages of the conventional semiconductor light emitting device.
Figure 2:
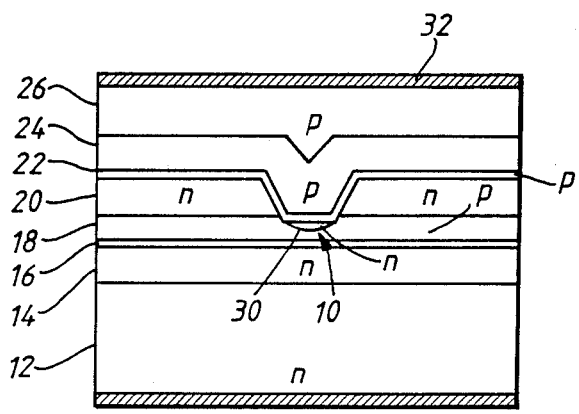
Figure 3:
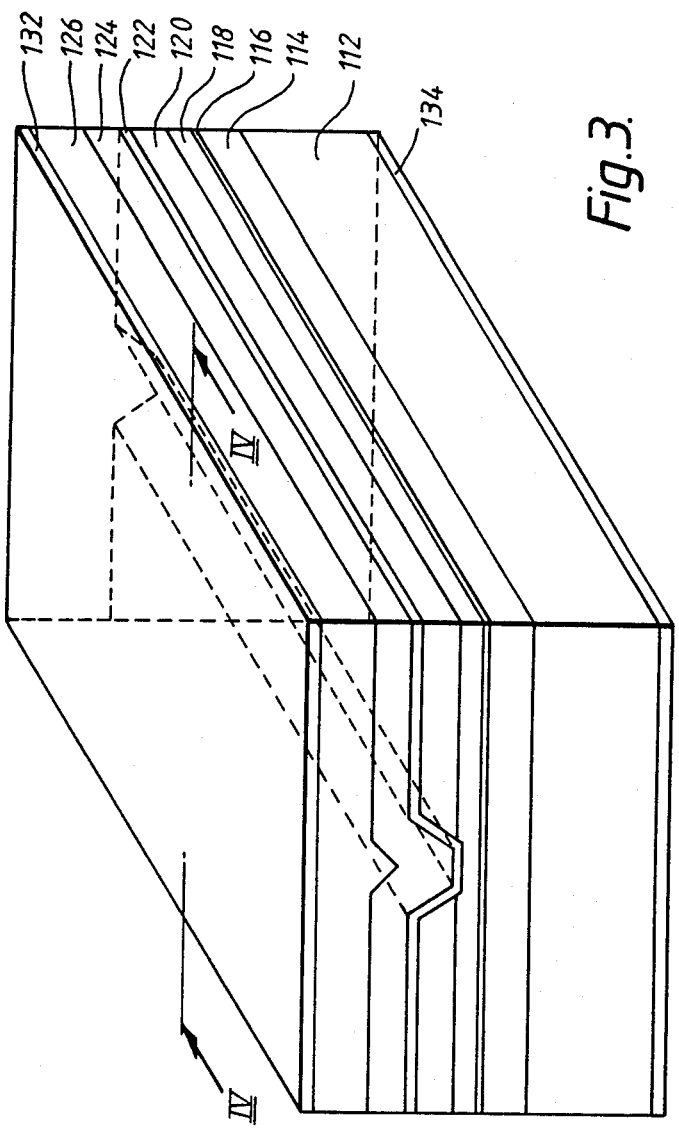
FIG. 3 is a perspective view of a semiconductor laser manufactured by the steps according to this invention.
Figure 4:
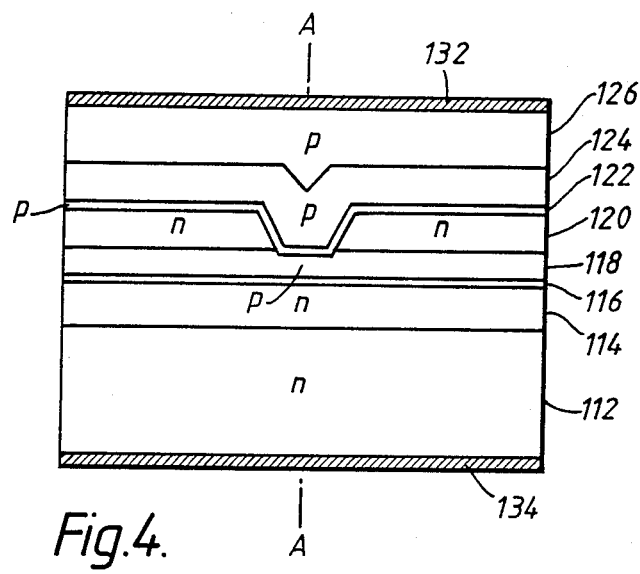
FIG. 4 is a IV—IV cross-sectional view of the device shown in FIG. 3.
Figure 5:
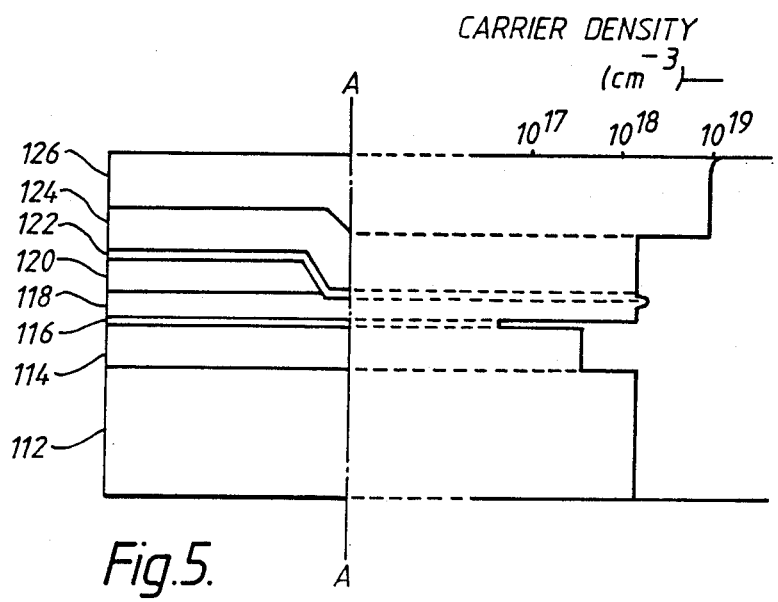
FIG. 5 shows distribution of carrier density along A—A line.

One embodiment according to this invention is described referring to FIGS. 3-7. FIGS. 3-5 show a semiconductor laser structure of this embodiment. Four layers are grown on an n-type Si-doped ($2 \times 10^{18}$ cm$^{-3}$) GaAs substrate 112 by MOCVD. The four layers are (1) the n-type Se doped ($5 \times 10^{17}$ cm$^{-3}$) $Ga_{0.6}Al_{0.4}As$ cladding layer 114 of 1.5 $\mu$m thickness, (2) the undoped $Ga_{0.94}Al_{0.06}As$ active layer 116 of 0.05 $\mu$m, (3) the p-type Zn doped ($2 \times 10^{18}$ cm$^{-3}$) $Ga_{0.6}Al_{0.4}As$ cladding layer 118 of 0.5 $\mu$m, and (4) the n-type Se doped ($7 \times 10^{17}$ cm$^{-3}$) $Ga_{0.6}Al_{0.4}As$ current blocking layer 120 of 1.5 $\mu$m thickness. The two layer structure of the current blocking layer 120 and the cladding layer 118 have a stripe-like groove. Further, three additional layers are grown on the above mentioned structure. These three layers are (1) the p-type Zn doped ($2 \times 10^{18}$ cm$^{-3}$) $Ga_{0.7}Al_{0.3}As$ optical guide layer 122 of 0.15 $\mu$m thickness, (2) the cladding layer 124, and (3) the p-type Zn doped ($1 \times 10^{19}$ cm$^{-3}$) GaAs contact layer 126 of 3 $\mu$m thickness. The p-type metal contact 132 of Ti/Pt/Au is evaporated onto the contact layer 126 and also the n-side metal contact 134 of AuGe/Ni/Au is evaporated onto the GaAs substrate 122.

FIG. 5 shows carrier density distribution along the line A—A of FIG. 4. At the interface between the cladding layer 118 and the optical guide layer 122, a p-type carrier layer is formed having a density which is higher than at the circumference. Also, the p-type carrier density at the surface of the contact layer 126 is higher than that of its circumference. The reason why the carrier density is high at the interface between the cladding layer 118 and the optical guide layer 122 is that the quantity of DEZn provided to the reactor to grow the optical guide layer 122 is larger than that of DEZn provided to grow the cladding layer 118 as mentioned below so that the partial pressure of Zn in the reactor might be higher than that of Zn contained in the cladding layer 118.

Figure 6A:
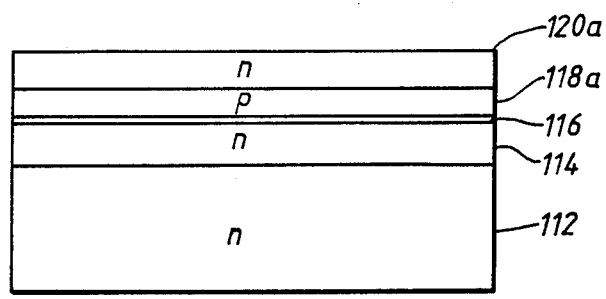
FIGS. 6A to 6C show the method of manufacturing semiconductor light emitting devices according to this invention with regard to the first embodiment of this invention.
Figure 6B:
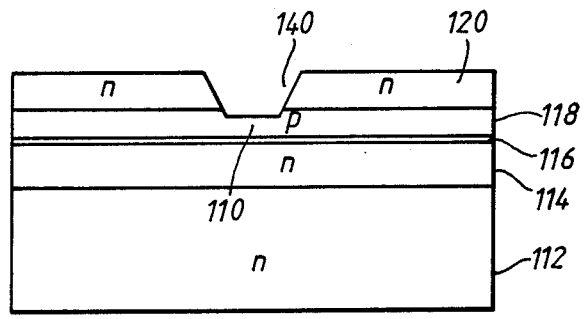
Figure 6C:
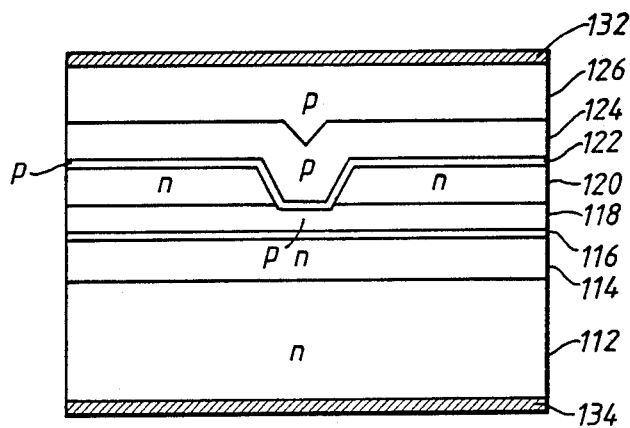

The following are the manufacturing steps of the above-mentioned semiconductor laser in reference to FIGS. 6A to 6C. As shown in FIG. 6A, the n-type cladding layer 114 of 1.5 $\mu$m thickness, the undoped $Ga_{0.94}Al_{0.06}As$ active layer 116 of 0.05 $\mu$m, the p-type $Ga_{0.6}Al_{0.4}As$ compound semiconductor layer 118a of 0.5 $\mu$m and the n-type Se doped GaAlAs compound semiconductor layer 120a of 1.5 $\mu$m thickness are grown on an n-type GaAs substrate 112 by MOCVD. This structure has a double heterojunction with the n-type cladding layer 114, the active layer 116 and the cladding layer 118. The p-n junction between the active layer 116 and the cladding layer 118 is a heterojunction formed between different materials.

Following the growth step, the compound semiconductor layers 118a and 120a are etched to form a groove of 2 μm stripe width by conventional photolithographic techniques as shown in FIG. 6B. For example, 8H$_2$SO$_4$+H$_2$O$_2$+H$_2$O (20° C.) can be used as the etchant. The groove 140 is etched completely through the compound semiconductor layer 118a until the stripe portion 110 under the groove 140 in the cladding layer 118 is 0.2 μm thick.

Figure 7:
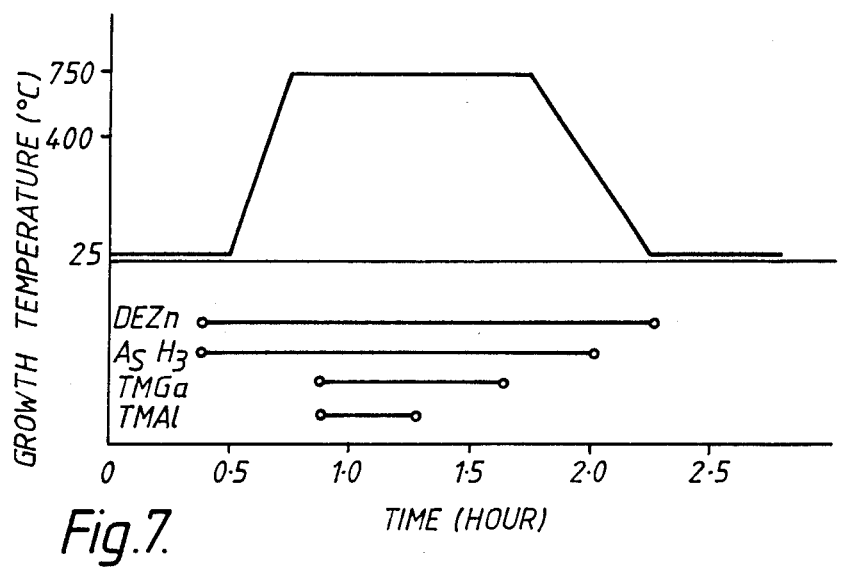
FIG. 7 shows a growth temperature program and a growth gas flow sequence in reference to the method of manufacturing a semiconductor light emitting device according to the first embodiment of this invention.
Figure 8:
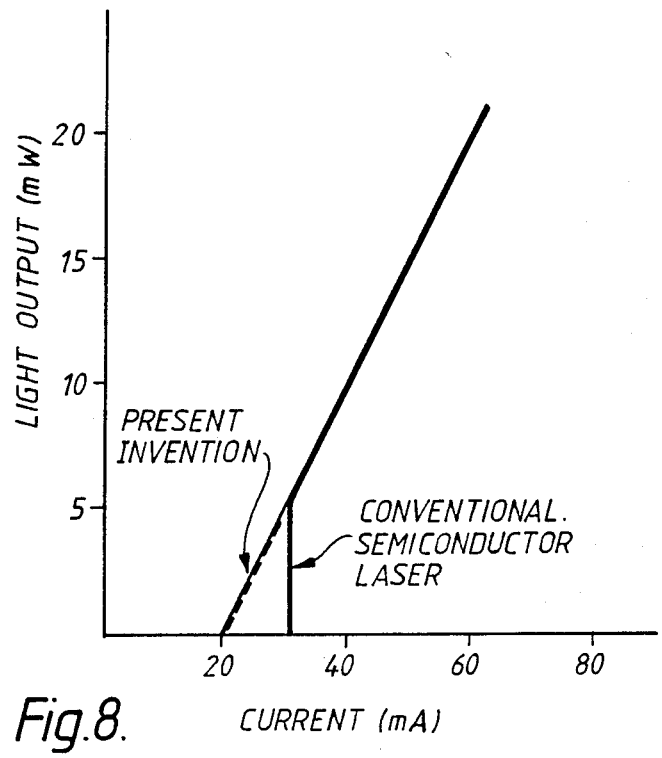
FIG. 8 shows light output versus current characteristics comparing the conventional semiconductor laser with the one manufactured by the method according to this invention.

After the etching process, the wafer is replaced in the reactor for the additional MOCVD layers according to the growth program including sequential control of the quantity of flowing gas as shown in FIG. 7. DEZn and AsH$_3$ is provided to the reactor 5 minutes before it starts to be warmed up. The quantity of DEZn is $1.06 \times 10^{-5}$ mol/min and that of AsH$_3$ is as much as that of H$_2$ by $2.5 \times 10^{-3}$ times. The quantity of DEZn is as much as that of DEZn provided to form the cladding layer 118 by 1.5 times. After 5 minutes, the reactor starts to warm up. When the temperature reaches 750° C., the surface oxide layer of the cladding layer 118 is cleaned up at that temperature for 25 minutes. Thereafter the growth of an additional layer is started. The condition of the atmosphere for the growth is as follows: The temperature is 750° C. and the pressure is 1 atm. The mol ratio of Group V to III is 20 and the growth speed is 0.26 μm/minute on GaAlAs. The total quantity of H$_2$, DEZn, AsH$_3$, TMGa and TMAl is 10 liters/minute. DEZn, AsH$_3$, TMGa and TMAl are caused to flow into the reactor by using H$_2$ as a carrier to grow the optical guide layer 122 and cladding layer 124. The flowing quantity of DEZn is determined by the formula that $DEZn/(TMGa+TMAl)=1.5\times10^{-2}$ mol ratio. After the optical guide layer 122 and the cladding layer 124 are grown, the contact layer 126 is grown. For this growth, the quantity of DEZn is determined by the formula that $DEZn/(TMGa+TMAl)=1.5\times10^{-1}$ mol ratio. After completion of the growth of the contact layer 126, the TMGa supply is stopped, but DEZn continues to flow into the reactor at the rate of $7.07\times10^{-5}$ mol/minutes until the reactor reaches room temperature. A metal contact 132 of Ti/Pt/Au is formed on top of the contact layer 126 and the other metal contact 134 of AuGe/Ni/Au is formed on top of the GaAs substrate 112.

The method according to this embodiment can prevent the density of Zn at the interface between the grown layer and the additionally grown layer from decreasing when additionally grown layers doped with Zn; such as the optical guide layer 122, the cladding layer 124 and the contact layer 126, are grown on the cladding layer 118 doped with Zn which has high partial vapor pressure because DEZn is provided before the reactor is heated so that the partial pressure of Zn in the reactor might be higher than that of Zn in the cladding layer 118. Therefore, current concentration is prevented unlike the conventional device. The threshold current to start the laser oscillation also becomes lower. Another advantage is that Zn density at the surface of the contact layer 126 is prevented from decreasing because DEZn continues to flow into the reactor after the completion of the contact layer 126. Accordingly, as the contact resistance between the metal contact 132 and the contact layer 126 becomes lower, the operation temperature of the semiconductor laser is prevented from rising high and the lifetime of the device is increased.

In another aspect, the surface of the GaAlAs crystal is generally apt to be oxidized so that the surface of the cladding layer or stripe portion might be covered with natural oxide layers such as Al$_2$O$_3$, Ga$_2$O$_3$ or As$_2$O$_3$. The surface cleaning process cannot remove the oxide completely. This oxide results in a structure such as the p-type GaAlAs/oxide/p-type GaAlAs which causes a voltage drop, raising the operation temperature of the device and shortening the lifetime. According to the method of this embodiment, the density of the p-type impurity at the interface between the cladding layer 118 and the optical guide layer 122 can be so high that the oxide layer may be highly doped with the p-type impurity. Namely, there occurs no voltage drop at the interface.

As mentioned above, in this embodiment, the quantity of DEZn caused to flow into the reactor before heating may be more than that of DEZn caused to flow into the reactor after the completion of contact layer 12 which, in turn, may be the same as that of the DEZn caused to flow into the reactor at the growth step. However, this invention is not necessarily limited to these embodiments and may be changed depending on the crystal growth condition such as growth temperature.

From FIGS. 9A to 9E show a second embodiment according to this invention. This embodiment is a method of manufacturing a surface light emitting diode.

Figure 9A:
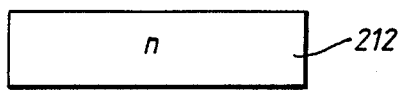
FIGS. 9A to 9E are cross-sectional views of a semiconductor light emitting device in reference to the second embodiment of this invention.
Figure 9B:
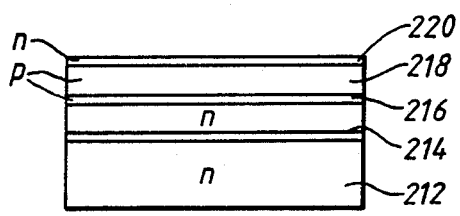

At first, the n-type GaAs substrate 212 is prepared as shown in FIG. 9A. On the substrate 212, the n-type Se-doped ($5\times10^{17}$ cm$^{-3}$) Ga$_{0.6}$Al$_{0.4}$As semiconductor layer 218 of 1.5 μm thickness and the n-type Se doped ($5\times10^{17}$ cm) Ga$_{0.6}$Al$_{0.4}$As semiconductor layer 220 of 1.0 μm thickness are grown by MOCVD as shown in FIG. 9B.

This semiconductor structure has a double heterojunction with an n-type semiconductor layer 214, a p-type GaAs layer 216 and a p-type semiconductor layer 218. The p-n junction between the semiconductor layer 114 and the GaAs layer 116 is a heterojunction.

Figure 9C:
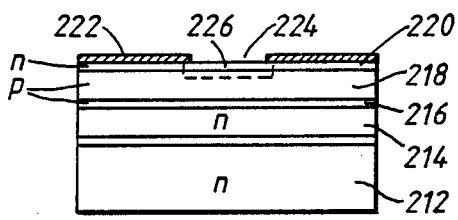
Figure 9D:
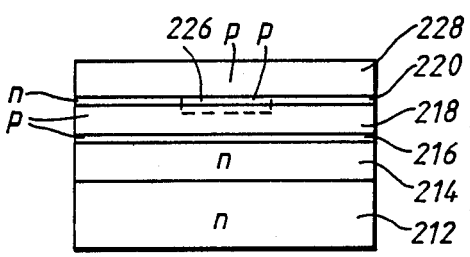
Figure 9E:
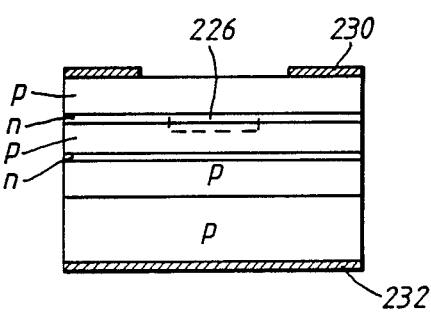

After the first growth step with MOCVD, as shown in FIG. 9C, a SiN layer 222 of 500 nm is deposited on the semiconductor layer 220 with CVD and an opening 224 of 30 micrometers in diameter is formed almost at the center of the SiN layer 222 using photolithographic techniques. Through this opening 224, Zn is diffused into the semiconductor layer 218 to turn the portion 226 of the semiconductor layer 220 under the opening 224 to p-type.

An additional growth step with MOCVD follows to grow a p-type Ga$_{0.6}$Al$_{0.4}$As semiconductor layer 228 on the above-mentioned structure. In this step, DEZn is caused to flow into the reactor before the reactor is heated up to grow a semiconductor layer 228 so that the Zn density of the p-type region 226 might be prevented from decreasing. A metal contact 23 of p-type side is formed on top of semiconductor layer 228 and the other contact 231 on top of semiconductor layer 212.

According to the method of this embodiment, the doping level of Zn in the p-type region 226 is prevented from decreasing. Therefore, the current flows uniformly in the region 226 so that the distribution of the brightness of the surface light emission may be uniform. In a conventional surface light emitting diode, the diameter of the emission might be as short as about 20 μm to achieve uniform light emission because the distance between the p-side metal contact 230 and the emission layer 216 is relatively small. Because of this structure, the conventional device cannot operate with high current which causes high heating value.

According to the method of this embodiment, a surface light emitting diode which can operate with high current or high power is easily fabricated.

Figure 10A:
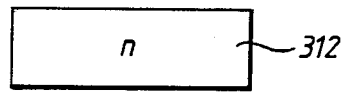
FIGS. 10A to 10E are cross-sectional views of the semiconductor light emitting devices in reference to the third embodiment of this invention.
Figure 10B:
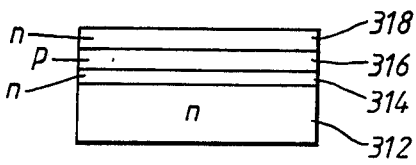
Figure 10C:
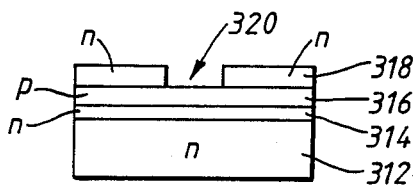
Figure 10D:
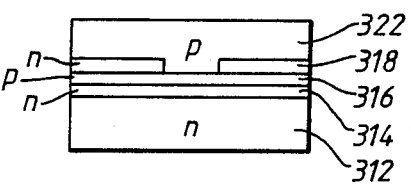
Figure 10E:
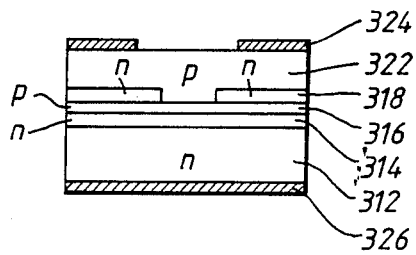

FIG. 10A to FIG. 10E show a third embodiment of this invention. As shown in FIG. 10A, an n-type GaAs substrate 312 is prepared. On this substrate 312, an n-type $Ga_{0.64}Al_{0.36}As$ semiconductor layer 314 of 1.5 μm thickness, a p-type $Ga_{0.64}Al_{0.36}As$ semiconductor layer 318 of 1.5 μm thickness and an n-type $Ga_{0.64}Al_{0.36}As$ semiconductor layer 318 of 1.5 μm thickness are sequentially grown by MOCVD. The semiconductor layer 312 is doped with Se ($5 \times 10^{17}$ cm$^{-3}$)

After the first growth step, the semiconductor layer 318 is chemically etched using conventional photolithographic techniques to form an opening of 50 μm through the layer 318 until the p-type semiconductor layer 316 is reached.

Thereafter, the above mentioned semiconductor structure is replaced in the reactor for additional growth. DEZn is caused to flow into the reactor before heating up. After a while, the reactor is heated to growth temperature so that the p-type $Ga_{0.64}Al_{0.36}As$ semiconductor layer 322 of 1.5 μm can be grown on the semiconductor layers 316 and 318. This semiconductor layer 322 is doped With Zn of $1 \times 10^{18}$ cm$^{-3}$ doping level. As DEZn exists in the reactor before heating up, the density of the p-type carrier in the semiconductor layer 31 can be prevented from evaporating through the exposed surface of the layer 31. This semiconductor structure has single homojunction between the semiconductor layer 314 and the semiconductor layer 316.

Thereafter, the p-side metal contact 324 of Ti/Pt/Au is formed on the semiconductor layer 322 and the n-side metal contact 326 of AuGe/Au is formed on the semiconductor layer 312. When voltage is applied to this light emitting diode, electrons are injected into the semiconductor layer 316 and holes are injected into the semiconductor layer 314 so that light emissions may be gained from both layers.

Figure 11A:
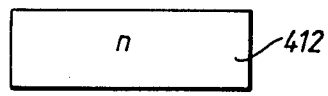
FIGS. 11A to 11E are cross-sectional views of the semiconductor light emitting devices in reference to the fourth embodiment of this invention.
Figure 11B:
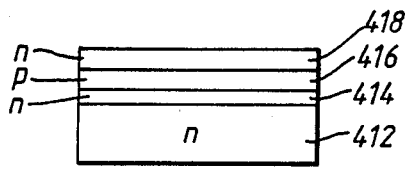
Figure 11C:
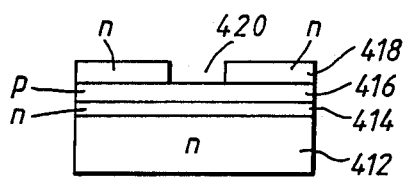
Figure 11D:
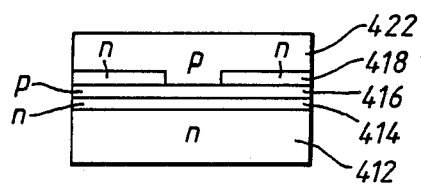
Figure 11E:
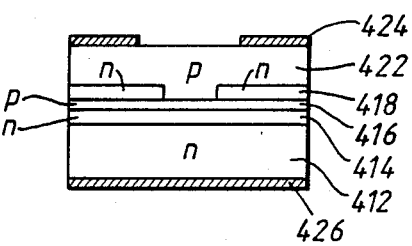

FIG. 11A to FIG. 11E show a fourth embodiment of this invention. As shown in FIG. 11A, an n-type GaAs substrate 412 is prepared. On the substrate 412, an n-type $Ga_{0.6}Al_{0.4}As$ semiconductor layer 414 of 1.5 μm, a p-type $Ga_{0.64}Al_{0.36}As$ semiconductor layer 416 of 1.5 μm thickness and an n-type $Ga_{0.64}Al_{0.36}As$ semiconductor layer 418 of 1.5 μm are sequentially grown by MOCVD.

The semiconductor layer 414 is doped with Se ($5 \times 10^{17}$ cm$^{-3}$), the semiconductor layer 416 is doped with Zn ($1 \times 10^{18}$ cm$^{-3}$) and the semiconductor layer 418 is doped with SE ($5 \times 10^{17}$ cm$^{-3}$).

After the first growth step, the semiconductor layer 418 is chemically etched using conventional photolithographic techniques to form an opening 420 of 50 μm through the layer 418 to the p-type layer 416.

Thereafter, the above mentioned semiconductor structure is replaced in the reactor. DEZn is caused to flow into the reactor before heating up. After a while, the reactor is heated up to the growth temperature so that p-type $Ga_{0.64}Al_{0.36}As$ semiconductor layer 422 of 1.5 μm thickness might be grown on the semiconductor layers 416 and 422. This semiconductor layer 422 is doped with Zn of $1 \times 10^{18}$ cm$^{-3}$. Because DEZn is caused to flow into the reactor before heating up, the carrier in the p-type semiconductor layer 416 is prevented from evaporating through the surface of the layer 412 so as not to reduce the doping level. This semiconductor structure has a single heterojunction between the $Ga_{0.6}Al_{0.4}As$ layer 414 and the $Ga_{0.64}Al_{0.36}As$ layer 416.

Thereafter, the p-side metal contact 424 of Ti/Pt/Au is formed on the semiconductor layer 422 and the n-side metal contact 426 of AuGe/Au is formed on the semiconductor layer 412.

When voltage is applied to this device, electrons are injected into the p-type semiconductor layer 416 but holes are not injected into the semiconductor layer 414 because of the potential of about 44meV at the p-n junction. Further, there is a difference of the refractive index between the n-type layer 414 and the p-type layer 416. Accordingly, the light emission of this heterojunction diode is more efficient than that of the homojunction diode.

This invention is not limited to the above-mentioned embodiments. The compound semiconductor material grown at the additional growth step is not limited to GaAlAs. Any other compound semiconductor crystal highly doped with a p-type dopant such as InGaAlAs or GaAlAsP might be used.

In addition, as this invention can overcome the disadvantage of aluminum oxide, it is especially efficient to the method of manufacturing a semiconductor light emitting device having a compound semiconductor crystal containing aluminum. The p-type impurity employed in this invention is not limited to Zn but Group II elements such as Cd or Mg might also be available.

Finally, this invention is also applicable to a semiconductor light emitting device which requires additional crystal growth steps after the first growth of a semiconductor layer.

Although the present invention has been shown and described with respect to preferred embodiments, various changes and modifications which are obvious to a person skilled in the art to which the invention pertains are deemed to lie within the spirit and scope of the invention.

What is claimed is:

1. A method of manufacturing a semiconductor device comprising the steps of:

forming a layered compound semiconductor structure with a p-n junction therein having a first p-type compound semiconductor crystal layer containing aluminum, with the first p-type compound semiconductor crystal layer having an exposed surface portion at the top layer of the structure and unexposed portions;

flowing a p-type dopant into a reactor in which said compound semiconductor structure is placed so that the exposed surface portion of said first p-type compound semiconductor crystal layer has a higher carrier density than the unexposed regions of the first p-type compound semiconductor crystal layer; and growing a second p-type compound semiconductor crystal layer containing aluminum on said exposed surface portion of said first p-type compound semiconductor crystal layer in said reactor.

2. The method according to claim 1, wherein said forming step comprises forming said first and second p-type compound semiconductor crystal layers of $Ga_{1-x}Al_xAs$, where x is a predetermined number less than 1.

3. The method according to claim 1, wherein the dopant flowing step causes the acceptor density at the interface between said first and second p-type semiconductor crystal layers to be equal to or higher than that of said first or second p-type semiconductor crystal layer.

4. The method according to claim 1, comprising the further step of growing said second p-type compound semiconductor crystal layer by metalorganic chemical vapor deposition.

5. The method according to claim 1, wherein the step of forming said layered compound semiconductor structure comprises the steps of:

forming a double heterostructure of $Ga_{1-x}Al_xAs$, where x is a predetermined number less than 1;

forming an n-type GaAlAs current blocking layer on said double heterostructure; and etching said current blocking layer to expose a portion of said first p-type compound semiconductor crystal layer.

6. A method of manufacturing a semiconductor device comprising the steps of:

forming a layered compound semiconductor structure with a p-n junction therein having a first p-type compound semiconductor crystal layer containing aluminum, said first p-type compound semiconductor crystal layer having an exposed portion as the top layer of the structure and unexposed portions;

flowing a p-type dopant into a reactor in which said compound semiconductor structure is placed so that the exposed surface portion of said first p-type compound semiconductor crystal layer has a higher carrier density that the other, unexposed regions of said first p-type compound semiconductor crystal layer;

growing a second p-type compound semiconductor crystal layer containing aluminum on the exposed surface portion of said first p-type compound semiconductor crystal layer in said reactor; and continuing to flow said p-type dopant into said reactor after completion of the growth of said second compound semiconductor crystal layer.

7. The method according to claim 6, the structure forming step comprises forming said first and second p-type compound semiconductor crystal layers of $Ga_{1-x}Al_xAs$, where x is a predetermined number less than 1.

8. The method according to claim 6, wherein the dopant flowing step causes the acceptor density at the interface between said first and second p-type semiconductor crystal layer to be equal to or higher than that of said first or second p-type semiconductor crystal layer.

9. The method according to claim 6, wherein the growing step comprises growing said second p-type compound semiconductor crystal layer by metalorganic chemical vapor deposition.

10. The method according to claim 6, wherein the step for forming said compound semiconductor structure comprises the steps of:

forming a double heterostructure of GaAlAs;

forming an n-type GaAlAs current blocking layer on said double heterostructure; and etching said current blocking layer to expose a portion of said first p-type compound semiconductor crystal layer.

11. The method according to claim 6, wherein the dopant flowing step causes acceptor density of the surface of said second p-type compound to be more than $1 \times 10^{19}$ cm$^{-3}$.

* * * * *